(12) United States Patent
Zhuang et al.

(10) Patent No.: US 7,842,579 B2
(45) Date of Patent: Nov. 30, 2010

(54) METHOD FOR MANUFACTURING A SEMICONDUCTOR DEVICE HAVING DOPED AND UNDOPED POLYSILICON LAYERS

(75) Inventors: Haoren Zhuang, Hopewell Junction, NY (US); Matthias Lipinski, Poughkeepsie, NY (US); Jingyu Lian, Hopewell Junction, NY (US); Chandrasekhar Sarma, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 726 days.

(21) Appl. No.: 11/625,573

(22) Filed: Jan. 22, 2007

(65) Prior Publication Data
US 2008/0173958 A1    Jul. 24, 2008

(51) Int. Cl.
*H01L 21/331* (2006.01)
(52) U.S. Cl. .......... 438/361; 438/430; 257/E21.197
(58) Field of Classification Search ........ 438/361, 438/430; 257/E21.197
See application file for complete search history.

(56) References Cited

U.S. PATENT DOCUMENTS

| 6,750,487 | B2 | 6/2004 | Fried et al. | |
|---|---|---|---|---|
| 6,833,588 | B2 | 12/2004 | Yu et al. | |
| 6,930,362 | B1 | 8/2005 | Mirabedini et al. | |
| 6,995,065 | B2 | 2/2006 | Chou et al. | |
| 7,026,688 | B2 | 4/2006 | Kim et al. | |
| 7,045,422 | B2 | 5/2006 | Enders et al. | |
| 7,056,814 | B2 | 6/2006 | Kim | |
| 2004/0209411 | A1* | 10/2004 | Fisher et al. | 438/197 |
| 2007/0249077 | A1* | 10/2007 | Sze et al. | 438/48 |

* cited by examiner

*Primary Examiner*—Thanh V Pham
(74) *Attorney, Agent, or Firm*—Banner & Witcoff, Ltd.

(57) ABSTRACT

Various illustrative embodiments of methods for manufacturing a semiconductor device are described. These methods may include, for example, forming a first polysilicon layer above a substrate, wherein the first polysilicon layer comprises a doped portion, and forming a second polysilicon layer over a surface of the first polysilicon layer. Also, various illustrative embodiments of semiconductor devices are described that may be manufactured such as by the various methods described herein.

21 Claims, 6 Drawing Sheets

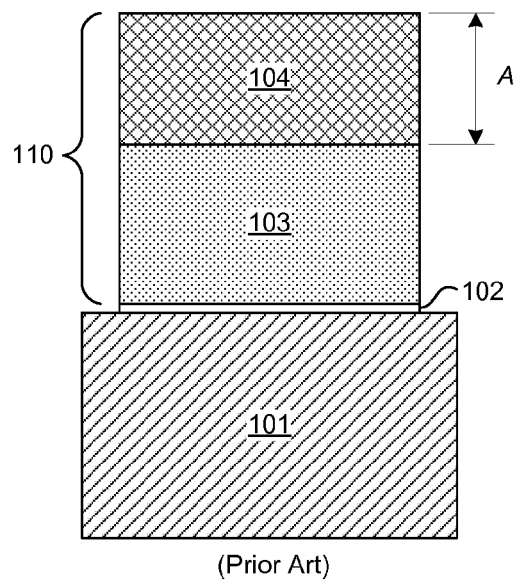
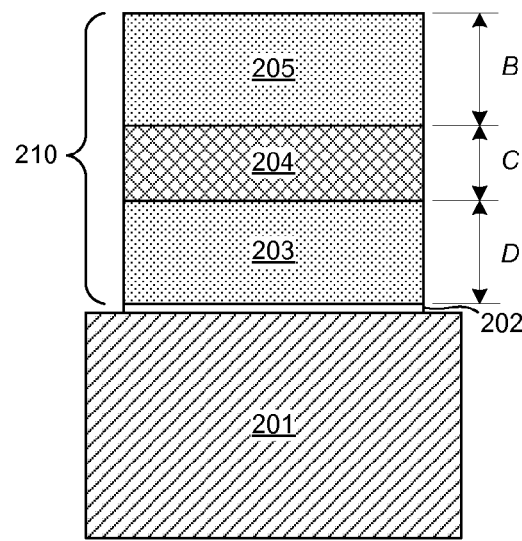
Fig. 1 (Prior Art)
Fig. 2
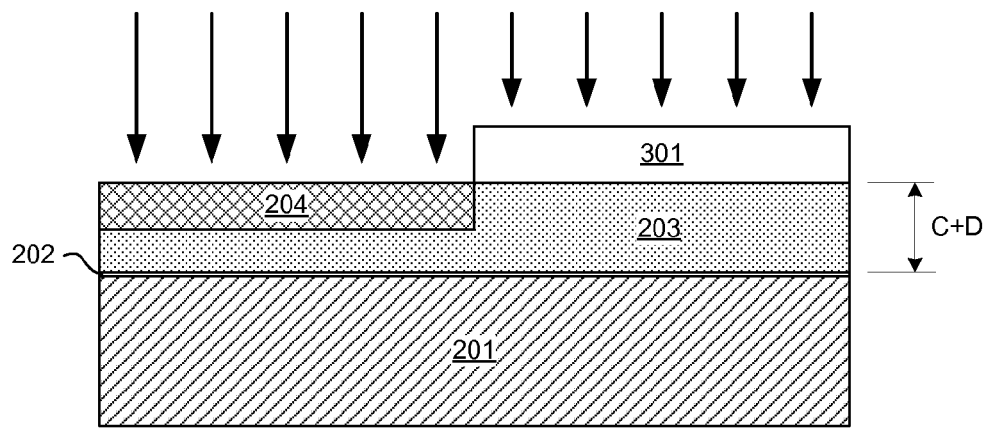
Fig. 3

METHOD FOR MANUFACTURING A SEMICONDUCTOR DEVICE HAVING DOPED AND UNDOPED POLYSILICON LAYERS

BACKGROUND

Semiconductor devices are manufactured layer-by-layer using a variety of processes that may be considered to generally fall into four categories: forming layers, doping/annealing layers, patterning layers, and removing layers. For example, when forming an n-type field-effect transistor (NFET) in a device, it is typical to form a layer of polycrystalline silicon (also known as polysilicon) on a layer of silicon dioxide, which is in turn formed on a layer of mono-crystalline silicon. Then, n-type dopant ions, such as phosphorus, are introduced into portions of the polysilicon, such as with a particle beam. A polymer photo-resist layer is then formed on the doped polysilicon layer, and a pattern is optically projected onto the photo-resist layer (a technique known as lithography). Next, the photo-resist layer is developed such that portions of the photo-resist layer corresponding to the projected pattern are removed to expose portions of the underlying polysilicon. The exposed portions of polysilicon are etched away using the remaining photo-resist layer as a mask. The device may be carefully heated and cooled (a process known as annealing) to incorporate the dopants into the polycrystalline structure of the polysilicon. The result, when viewed from an overhead plan perspective, is a pattern of thin polysilicon lines extending across the surface of the device, which eventually are used as NFET gates and/or signal transmission lines. P-type field-effect transistor (PFET) gates are manufactured in a similar manner, except that p-type polysilicon doping is typically used. Other techniques may additionally or alternatively be used.

The thickness and pitch of the polycrystalline line is dictated by the technology, which is continuing to shrink as per Moore's Law. For example, for 45 nm technology, the minimum polycrystalline line width is about 40 nm with a pitch of about 140 nm. With feature sizes still shrinking, any variation of line width within a chip, commonly referred to as ACLV (across chip linewidth variation) becomes a major factor in lowering the clock speed of the chip. Among other factors, photo-resist thickness also contributes to the increase of ACLV during post etch. The thicker the photo-resist, the greater the ACLV. More particularly, the ACLV increases as the gate-to-resist thickness ratio decreases. It is therefore desirable to use the thinnest photo-resist layer possible. Typical gate-to-resist thickness ratios are 0.7 or less. On the other hand, during etching of the polysilicon, the photo-resist layer is also etched, albeit at a slower rate than the polysilicon. Thus, there are opposing factors between reducing the thickness of the photo-resist layer in order to decrease ACLV and providing a photo-resist layer that is sufficiently thick to withstand the etching process and protect the underlying polysilicon.

SUMMARY

This summary is provided to introduce a selection of concepts in a simplified form that are further described below in the Detailed Description. This summary is not intended to identify key features or essential features of the claimed subject matter, and instead presents various illustrative aspects described herein.

For example, according to some aspects, various illustrative embodiments of methods for manufacturing a semiconductor device are described. These methods may include, for example, forming a first polysilicon layer above a substrate, wherein the first polysilicon layer comprises a doped portion, and forming a second polysilicon layer over a surface of the first polysilicon layer.

According to further aspects, various illustrative embodiments of semiconductor devices are described that may be manufactured such as by the various methods described herein.

These and other aspects of the disclosure will be apparent upon consideration of the following detailed description of illustrative embodiments.

BRIEF DESCRIPTION OF THE DRAWINGS

A more complete understanding of the present disclosure may be acquired by referring to the following description in consideration of the accompanying drawings, in which like reference numbers indicate like features, and wherein:

FIG. 1 is a side cut-away view of a conventional polysilicon structure of a semiconductor device, prior to annealing.

FIG. 2 is a side cut-away view of an illustrative embodiment of a sandwich configuration of a polysilicon structure of a semiconductor device, prior to annealing, according to at least one aspect as described herein.

FIG. 3 is a side cut-away view of the embodiment of the semiconductor device of FIG. 2 during manufacturing, in which n-type dopant ions are implanted into an illustrative exposed portion of the polysilicon structure.

Figure 4:
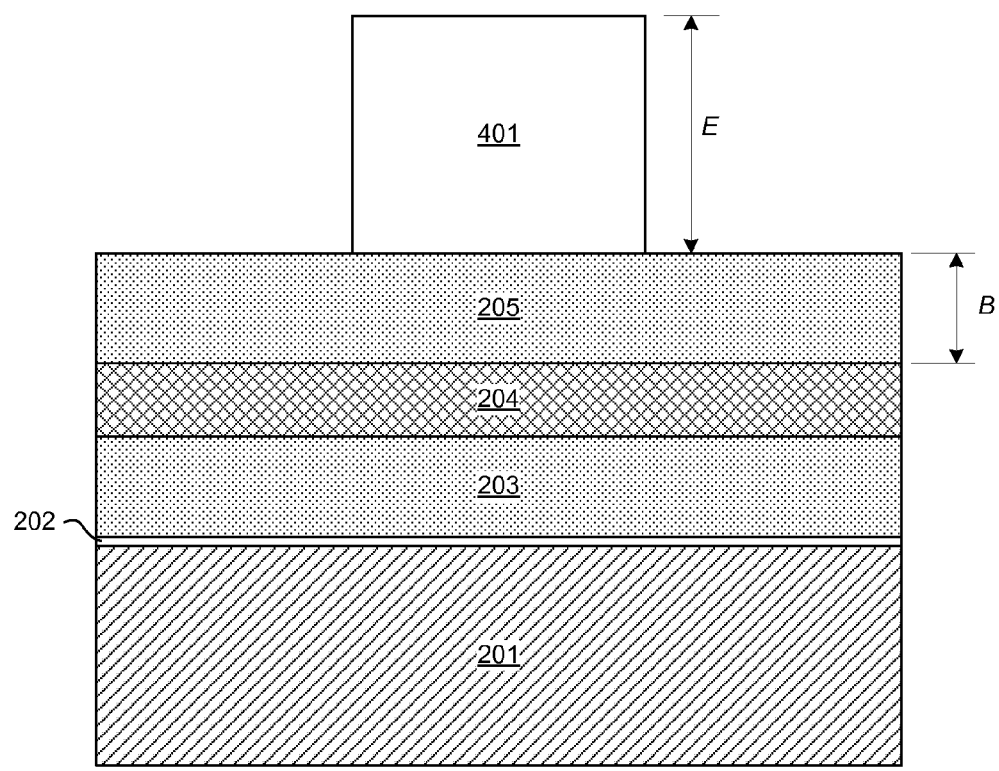
FIG. 4 is a side cut-away view of the embodiment of the semiconductor device of FIG. 3, wherein an illustrative photo-resist layer is formed on a portion of the polysilicon structure.

It is noted that the various drawings are not necessarily drawn to scale.

DETAILED DESCRIPTION

The various aspects summarized previously may be embodied in various forms. The following description illustrates various embodiments and other configurations in which the aspects may be practiced. It is understood that the described embodiments are merely examples, that other embodiments may be utilized, and that structural and functional modifications may be made, without departing from the scope of the present disclosure. It is noted that various layers are set forth as being adjacent to one another in the following description. Unless otherwise specified, such layers may be directly and physically in contact with each other or a material may intervene between such layers, and in any event this specification is not intended to be limiting in this respect.

In view of the discussion in the Background section above, it is desirable to reduce the thickness of the photo-resist layer that is used as a mask during polysilicon etching, while at the same time providing sufficient photoresist thickness to protect the underlying polysilicon that is not to be etched. Reducing the thickness of the photo-resist layer may, in turn, reduce the ACLV. Unfortunately, this has not been possible since reducing the photo-resist thickness any further would enable the etchants to consume resist through the entire photo-resist thickness, resulting in mouse bites (i.e., pitting) in the polysilicon lines. Such pitting can harm the performance and reliability of the semiconductor device.

In various embodiments, improved ACLV and/or other potential advantages may be realized through the use of a pre-anneal sandwich polysilicon gate structure. In such a structure, a doped (e.g., n-doped or p-doped) polysilicon layer is disposed between undoped polysilicon layers. Due to the proximity of the doped region to the gate oxide layer, the doped region may be made thinner than previous doped regions disposed at the top of the gate structure. The thinner doped region, in turn, may allow for a shortened etching of the doped region, thereby allowing a reduction in the amount of photo-resist consumed during doped polysilicon etching as well as a reduced thickness of the photo-resist layer as originally applied. This reduction in applied photo-resist thickness may provide an improved ACLV.

One or more potential advantages may be realized by the use of such a sandwich-style polysilicon structure. First, the total thickness of the photo-resist mask may be reduced, thereby also allowing for a reduced linewidth and/or ACLV. Second, less doping energy may be needed, thus possibly reducing the cost of doping, which requires a significant amount of energy. This is because in such a sandwich-style structure, the dopant may be located closer to the middle of the structure than in conventional polysilicon structures. Therefore, the dopant would not need to migrate as far during annealing, and less total dopant may be needed. Third, less fluorine-based chemicals may be needed during doped polysilicon etching, since a thinner region of the polysilicon is doped prior to annealing. Fluorine-based chemicals, as well as the waste products from their use, are dangerous and expensive to handle and dispose of and are harmful to the environment. Thus, any reduction in the use of such fluorine-based chemicals may be desirable.

To manufacture such a tri-layer polysilicon structure, a first layer of undoped polysilicon may be formed, a portion of the first polysilicon layer may be doped (thus forming an undoped lower layer and a doped layer above the un-doped layer), and then another layer of undoped polysilicon may be formed above the doped first polysilicon layer. In various embodiments, because the doping of the first polysilicon layer does not necessarily reach entirely down to the bottom of the first polysilicon layer, the tri-layer sandwich structure described above results. The structure may then be annealed to distribute the dopant, especially to the interface between the polysilicon structure and the underlying gate oxide layer.

Before describing various illustrative embodiments of tri-layer polysilicon structures, an illustrative embodiment of a bi-layer polysilicon structure will be introduced for the purpose of comparison.

FIG. 1 shows an illustrative embodiment of a bi-layer semiconductor device, in which a polysilicon gate 110 is disposed above a mono-crystalline silicon layer 101, with a gate oxide layer 102 (such as silicon dioxide) disposed between polysilicon gate 110 and silicon layer 101. Polysilicon gate 110 is shown in FIG. 1 at a point during manufacturing of the semiconductor device prior to annealing of polysilicon gate 110. Thus, polysilicon gate 110 at this point during manufacturing includes two layers: an upper doped polysilicon layer 104 and a lower undoped polysilicon layer 103. After annealing, the two layers 103 and 104 are substantially merged together by way of the dopants in layer 104 migrating into layer 103 toward gate oxide layer 102. In addition, annealing causes the dopants to become activated. The result is that gate 110 as a whole is conductive.

As a result of annealing, it is desirable for the dopants of layer 104 to migrate substantially throughout layer 103 and to be adjacent to gate oxide layer 102. This allows a transistor that will be built using gate 110 to be fast and power efficient. Without the proper dopant distribution and density being present in the final product, gate 110 would be less uniformly conductive, and the electric field induced across gate oxide layer 102 would be weaker, thus resulting in a transistor that is slower and that requires more power.

To allow for proper dopant distribution and density after annealing, during manufacturing the dopant is added to the top of gate 110 (resulting in layer 104) to a desired depth, or thickness, A. If depth A is too shallow, then there is a risk that the resulting annealed gate 110 will not have the proper dopant distribution. Depth A is typically at least forty percent of the total height of gate 110. For instance, where the total height of gate 110 is about 1200 angstroms, the thickness of doped layer 104 may be about 500 angstroms.

In such a bi-layer polysilicon structure 110, it may generally be considered that two etching steps are used to etch the polysilicon: one for upper doped layer 104 and another for lower undoped layer 103. It may be desirable, during etching of doped layer 104, to use an etchant that produces sufficient passivation for n-doped polysilicon. It may also be desirable that the etchant attacks exposed undoped and/or p-doped regions of polysilicon (not shown) to a similar degree, since these materials may also need to be simultaneously etched with similar profiles and/or critical dimensions. Etchants having both of these qualities typically do not substantially distinguish between polysilicon and photo-resist. This means that etching doped layer 104 using such an etchant consumes a relatively large portion of the protective photo-resist mask layer (not shown). The etching of the remaining undoped polysilicon and underlying silicon dioxide layer using an etchant such as hydrogen bromide (HBr) consumes a smaller portion of the photo-resist.

For instance, referring to the example in Table 1, etching doped polysilicon layer 104 consumes about 1000 angstroms of photo-resist, and etching undoped polysilicon layer 103 consumes only about 160 angstroms of photo-resist. Thus, if the amount of doped polysilicon etching were reduced, this would result in a significant reduction in photo-resist consumption and thus the amount of photo-resist needed to be deposited.

TABLE 1

Etching Budget for Conventional Poly Gate
(1200 angstroms total height)

| Etching Step | Time (sec) | Remaining Resist/ARC (angstroms) | Etching Technique |
|---|---|---|---|
| initial | — | 1600 | — |
| doped poly etch | 70 | 600 | $CF_4/C_4F_8/N_2$ - IEPD |
| undoped poly etch | 52 | 440 | $HBr/O_2$ - end point |
| oxide etch | 66 | 290 | $HBr/O_2$ - time |

However, reducing the thickness of doped layer 104 is not feasible because the final annealed polysilicon gate would not have a sufficient distribution of dopants throughout gate 110, which would reduce the conductance of the polysilicon gate, especially near the underlying gate oxide layer 102. A reduced polysilicon gate line conductance increases the power consumption and lowers the speed of the NFET utilizing gate 110. High conductance of polysilicon gate 110 is even more important near gate oxide layer 102 for proper NFET operation.

In various embodiments, as an alternative approach, a tri-layer pre-anneal polysilicon structure may be formed. For example, an illustrative embodiment of a sandwich-style tri-layer polysilicon gate line 210 is shown in FIG. 2. Gate 210 is disposed above a silicon layer 201. A gate oxide layer 202 (such as silicon dioxide) is disposed between polysilicon gate 210 and silicon layer 201. As was the case in FIG. 1, polysilicon gate 210 is shown in FIG. 2 at a point during manufacturing of the semiconductor device prior to annealing of polysilicon gate 210. At this point during manufacturing, polysilicon gate 210 effectively includes three layers: a first undoped polysilicon layer 205 disposed above a doped polysilicon layer 204, which in turn is disposed above a second undoped polysilicon layer 203. Thus, doped layer 204 is sandwiched between undoped layers 203 and 205. As will be discussed further with regard to FIG. 3, doped layer 204 can be a doped region of polysilicon layer 203.

As to the structure of FIG. 2, annealing causes the three layers 203-205 to substantially merge together by way of the dopants in layer 204 migrating into layer 203 toward gate oxide layer 202 and migrating into layer 205 toward the top of gate 210. Also, as previously discussed, annealing causes the dopants throughout gate 210 to become activated. The result is that gate 210 as a whole is conductive.

As shown in FIG. 2, the total height of gate 210 is the sum of the thicknesses B, C, D of layers 205, 204, 203, respectively. Thicknesses B, C, and D may have any relationship to each other, however certain relationships may provide better results. In some embodiments, B may be less than or equal to C+D. For instance, thickness B may be about 20% to 50% of the total height of gate 210 and the sum of thicknesses C+D may be about 50% to 80% of the total height of gate 210. In alternative embodiments, B may be greater than C+D. In addition, while thickness C may be of any amount, C may be less than one third of the total height of gate 210. For example, in one illustrative embodiment, the total height B+C+D of gate 210 may be about 1200 angstroms, wherein C is about 400 angstroms or less, or even about 250 angstroms or less.

Table 2 shows an etching budget for a particular illustrative embodiment in which polysilicon gate 210 is 1200 angstroms in total height (i.e., B+C+D), in which B=360 angstroms, C=250 angstroms, and D=590 angstroms. In the example of Table 2, the total thickness of layers 203 and 204 (i.e., C+D), both of which are formed from the first polysilicon deposition, constitutes about 70% of the total polysilicon gate 210 height. For the same total gate height as in the example of Table 1, the etching of thinner doped polysilicon layer 204 according to Table 2 consumes only about 500 angstroms of photo-resist, and the etching of undoped polysilicon layers 203 and 205 consumes about 210 angstroms of photo-resist. Thus, the total photo-resist consumed in polysilicon etching is only about 710 angstroms, as compared with about 1160 angstroms in the example of Table 1. This means that, in the example of Table 2, an original photo-resist thickness of only 1150 angstroms is sufficient, whereas in the example of Table 1, an original photo-resist thickness of 1600 angstroms is needed. Thus, the gate-to-resist ratio in Table 1 would be 1200/1600, or 0.75, whereas for a photo-resist thickness of 1150 angstroms the ratio would be 1200/1150, or about 1.04. As previously mentioned, a higher gate-to-resist ratio provides an improved ACLV. In general, using the sandwich structure described herein, gate-to-resist ratios may be rather high, such as 0.8 or greater, and even 1.0 or greater.

TABLE 2

Etching Budget for Illustrative Sandwich Poly Gate
(H = 1200 angstroms total height)

| Etching Step | Time (sec) | Remaining Resist/ARC (angstroms) | Etching Technique |
|---|---|---|---|
| initial | — | 1150 | — |
| upper undoped poly etch | 27 | 1070 | HBr - time |
| doped poly etch | 35 | 570 | $CF_4/C_4F_8/N_2$ - IEPD |
| lower undoped poly etch | 44 | 440 | $HBr/O_2$ - end point |
| oxide etch | 66 | 290 | $HBr/O_2$ - time |

The amount of photo-resist saved in manufacturing polysilicon gate structure 210 as compared with polysilicon gate structure 110 depends upon the thickness of doped layer 204. The thinner doped layer 204 is, the less photo-resist needed. In general, assuming that gate structures 110 and 210 have the same total height H=B+C+D, the amount of photo-resist saved, Y, may be estimated as:

$$Y = \{RC_1(A-C)/A - RC_2(A-C)/(H-A)\},$$

where $RC_1$ is the amount of photo-resist consumed during etching of doped layer 104 and $RC_2$ is the amount of photo-resist consumed during etching of undoped layer 103. For example, referring to Table 1, $RC_1$=1600−600=1000 angstroms, and $RC_2$=600−440=160 angstroms, in this case. Thus, for instance, where doped layer 104 has a thickness A of 500 angstroms and doped layer 204 has a thickness C of only 400 angstroms, then the amount of photo-resist Y saved is about 180 angstroms. Thus, the total photo-resist needed in this example would be 1600−180=1420 angstroms. This would provide for a gate-to-resist ratio of 1200/1420, or about 0.85. Or, for instance, where doped layer 204 is further reduced such that thickness C is as small as 250 angstroms, the amount of photo-resist Y saved is about 450 angstroms. Thus, the total photo-resist needed in this example would be 1600−450=1150 angstroms, which would provide for a gate-to-resist ratio of 1200/1150, or about 1.04. This may also result in a significant improvement in ACLV.

Figure 9:
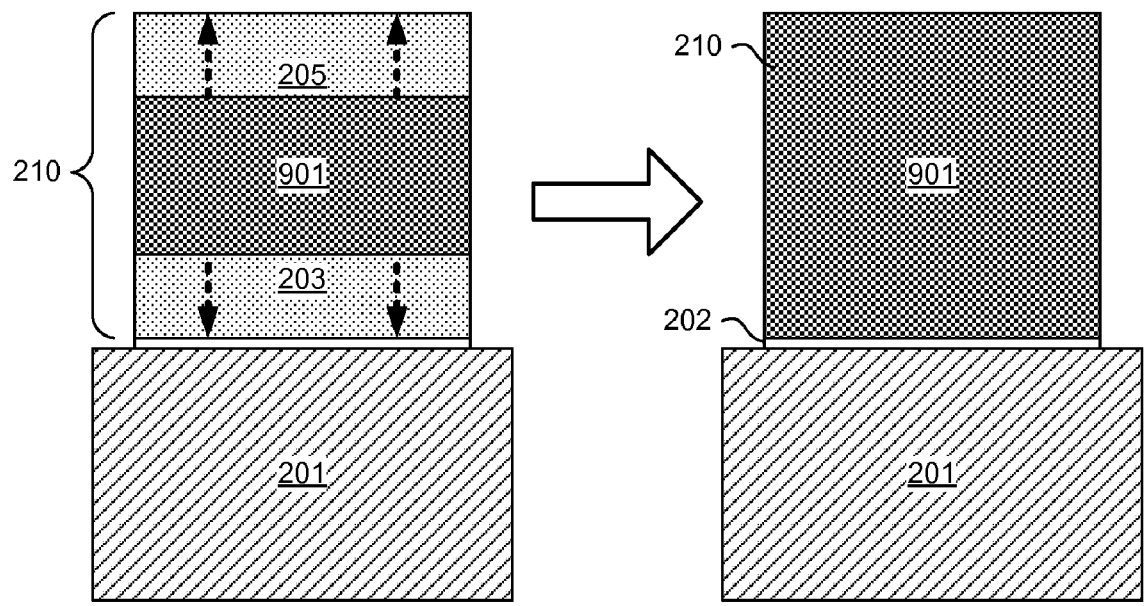
FIG. 9 is a side cut-away view of the embodiment of the polysilicon structure of FIG. 2, during annealing.
Figure 10:
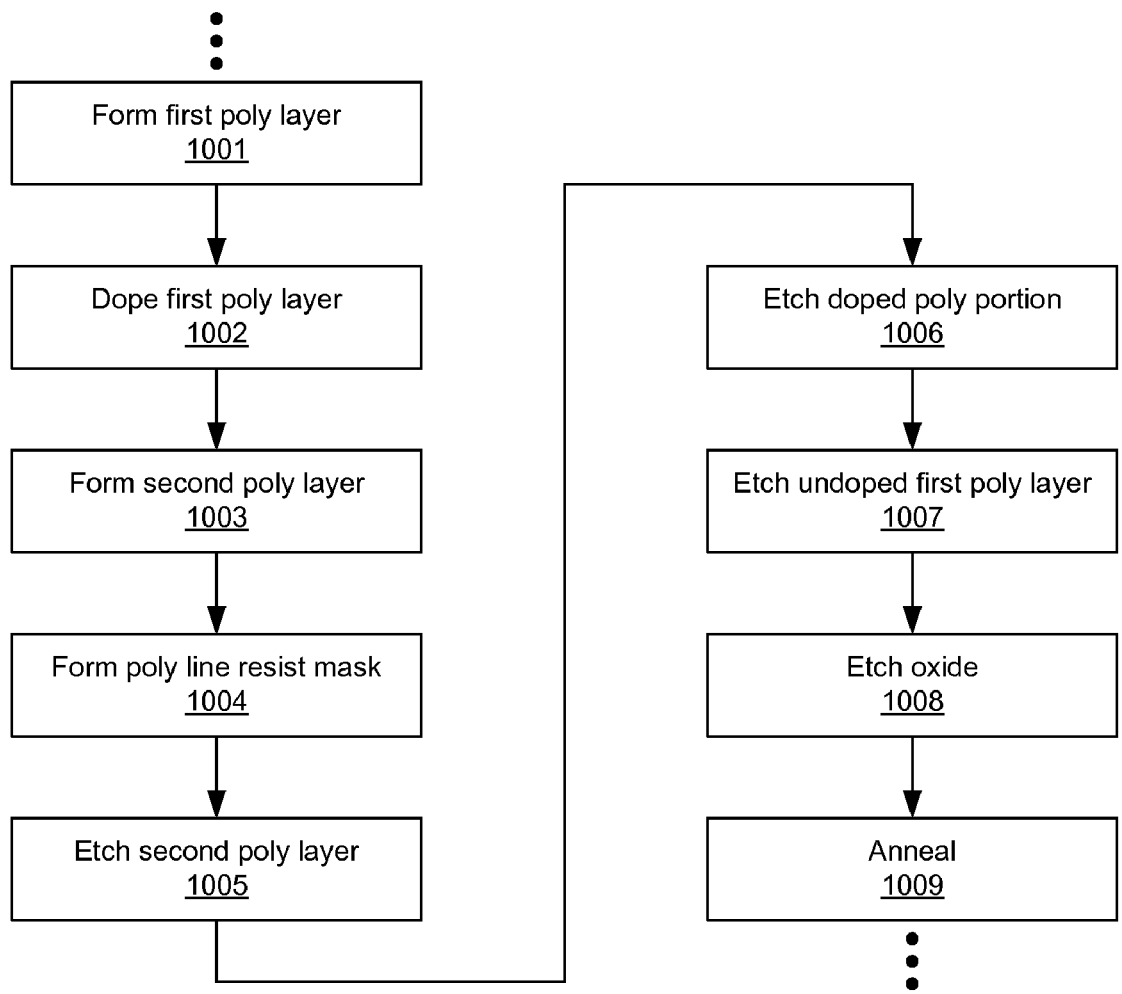
FIG. 10 is a flowchart showing steps of an illustrative embodiment of a method that may be performed to manufacture a semiconductor device having a polysilicon structure, in accordance with at least one aspect as described herein.

An illustrative embodiment of a method for manufacturing the gate structure of FIG. 2 will now be described with reference to FIGS. 3-10. It is noted that the various manufacturing steps described herein may be merely a subset of the total steps used in manufacturing the semiconductor device. For example, shallow trench isolation (STI) regions and wells may be formed in silicon layer 201 using well-known techniques prior to gate formation. Referring to FIGS. 3 and 10, gate oxide layer 202 is formed above silicon layer 201, such as by performing thermal oxidation of silicon layer 201. Gate oxide layer 202 may be relatively thin, such as about 20 angstroms in thickness. Next, polysilicon layer 203 having a thickness C+D is formed above gate oxide layer 202 (step 1001).

Silicon layer 201 may be part of or the entirety of a pre-formed silicon wafer, such as but not limited to a standard 300 millimeter diameter silicon wafer. Silicon layer 201 may be bulk silicon or it may be an upper layer of a standard silicon-on-insulator (SOI) wafer or another structure. In addition, although not explicitly shown, a well such as a p-type well may be formed in some situations in a portion of silicon layer 201 under the region where the gate structure is to be formed. In some embodiments, layer 201 may be another material or combination of materials, and may or may not include silicon and/or other materials such as any type of semiconductor material. More generally, for any of the embodiments, layer 201 may constitute, form a portion of, or be disposed above, any work piece made of any material(s) desired.

After polysilicon layer 203 is formed, a photo-resist layer 301 is formed above polysilicon layer 203 and patterned using standard photo-lithographic techniques to expose a portion of first polysilicon layer 203, as shown. Prior to lithography, a standard anti-reflective coating (ARC), not shown, may be deposited above photo-resist layer 301. Next, n-type dopant ions, such as phosphorus ions, are implanted into the exposed portion of polysilicon layer 203, as indicated by the arrows in FIG. 3 (step 1002). Ion implantation may be performed using any suitable method with suitable ion energies and dosages, such as but not limited to particle beam implantation. This implanting step results in doped polysilicon layer 204 being formed in an upper region of the exposed portion of polysilicon layer 203, such that doped polysilicon layer 204 has depth C. The amount of doping used may depend upon the location of the doping within the completed pre-anneal polysilicon structure as well as the desired thickness of the doped region. For instance, where it is desired to provide a doped layer 350 angstroms thick, doping may occur at an energy in the range of about 5 to 12 keV, such as about 7 keV, with a dose concentration in the range of about 3e15 to 5e15 atoms/$cm^2$, such as about 3.84e15 atoms/$cm^2$ or about 4.8e15 atoms/$cm^2$. This is in contrast with doping amounts used in, for instance, a 500 angstrom thick doped layer used in a conventional structure. In this case, more doping may be needed, such as at an energy of about 12 keV or more and a dose concentration of at least 4e15 atoms/$cm^2$, such as about 4.61e15 atoms/$cm^2$ or about 4.8e15 atoms/$cm^2$. After doping, photo-resist layer 301 is removed.

In various embodiments, the remaining portions of polysilicon layer 203 that were covered by photo-resist layer 301 may be doped with p-type dopant ions, such as boron ions. This may be accomplished by forming and patterning another photo-resist layer (not shown) that exposes portions that were covered by photo-resist layer 301 and covers portions exposed by photo-resist layer 301. In various embodiments, such p-type doping may be performed before or after the n-type doping described above. In various embodiments, two opposing types of polysilicon doping may be used together in, for example, complementary metal-oxide-semiconductor (CMOS) devices to provide for more efficient complementary transistor logic that includes, i.e., the use of both NFETs and PFETs in the same device. This is because NFETs typically use n-type doped polysilicon gates and PFETs typically use p-type doped polysilicon gates.

Next, referring to FIGS. 4 and 10, undoped polysilicon layer 205 of thickness B is formed above doped polysilicon layer 204 (step 1003), and another photo-resist layer 401 having thickness E is formed above undoped polysilicon layer 205. In addition, an ARC (not shown) may be deposited. In some embodiments, the ARC may be embodied as a TARC (top anti-reflective coating) above photo-resist layer 401 and/or as a BARC (bottom anti-reflective coating) under photo-resist layer 401. Then, photo-resist layer 401 is patterned using standard photo-lithographic techniques to expose a portion of undoped polysilicon layer 205, as shown (step 1004). In some embodiments, the shown remaining photo-resist layer 401 acts as a mask that covers a region where gate 210 is to be formed by etching the regions exposed by the mask 401.

Figure 5:
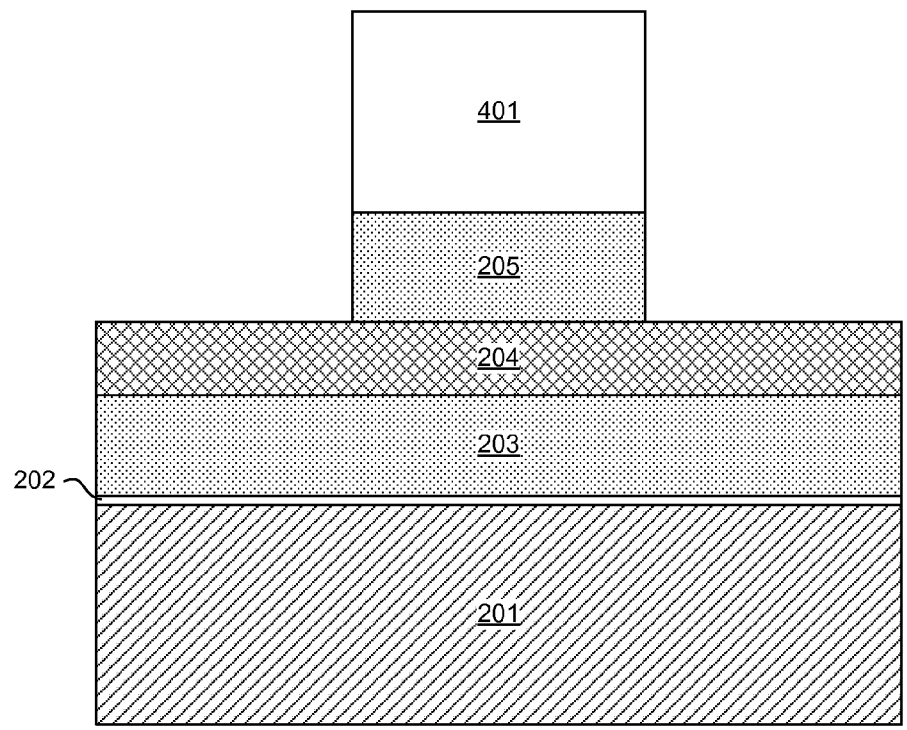
FIG. 5 is a side cut-away view of the embodiment of the semiconductor device of FIG. 4, wherein an upper undoped portion of the polysilicon structure is etched away using the photo-resist layer as a mask.

Next, referring to FIGS. 5 and 10, the exposed portions of polysilicon layer 205 are etched using layer 401 as a mask (step 1005). Since polysilicon layer 205 is undoped, etching in step 1005 may be performed using one or more appropriate etchants such as an etchant that selectively etches undoped polysilicon as compared with photo-resist (i.e., a high-selectivity etchant). For example, in some embodiments of step 1005, HBr plasma reactive ion etching (RIE) or another type of high-selectivity etching may be used. In further embodiments of step 1005, oxygen ($O_2$) plasma may also be included during etching of polysilicon layer 205 to help control etch rate. Etching using HBr (and optionally $O_2$) is a well-known technique for etching undoped polysilicon. In step 1005, it may be desirable to use a high-selectivity etchant so that the original thickness needed of photo-resist layer 401 may be reduced. It is noted that the etching in step 1005 may be, in some embodiments, a single etching step or may include, in other embodiments, multiple etching sub-steps performed simultaneously and/or in sequence. The result of etching in step 1005 is that portions of doped polysilicon layer 204 are exposed, as shown in FIG. 5.

It may be difficult to detect the end of undoped polysilicon layer 205 and the beginning of doped polysilicon layer 204, and so although end-point based etching may be used, in some embodiments time-based etching may result in a more accurate etching. In a time-based etching step, etching is performed for a predetermined period of time and stopped in response to that time period ending. The time period is determined based on the known etch rate of the material being etched and the desired etching depth. For instance, when etching undoped polysilicon using 20 mT/600 Wt/100 Wb/550 HBr/2O2, the etch rate is about fifteen angstroms per second. In the above etch recipe, 20 mT refers to 20 milli-Torrs of pressure, 600 Wt refers to 600 watts of top power, 100 Wb refers to 100 watts of bottom power, 550 HBr refers to a flow rate of 550 standard cubic centimeters per minute (sccm) of HBr gas, and 2O2 refers to a flow rate of 2 sccm of $O_2$ gas. If it were desired to etch undoped polysilicon to a depth of, for example, 360 angstroms, then the time period for etching would be determined as the etch rate multiplied by the depth, which in this case is about twenty-four seconds. In addition, the time period may be slightly increased to account for any possible under-etching. Since no real harm would likely be caused by HBr over-etching into underlying exposed doped polysilicon layer 204 (because n-doped polysilicon does not etch well using HBr), it may be desirable to slightly over-etch rather than under-etch in step 1005. This is especially true where the etching of doped polysilicon layer 204 uses end-point detection, as will be discussed below.

Figure 6:
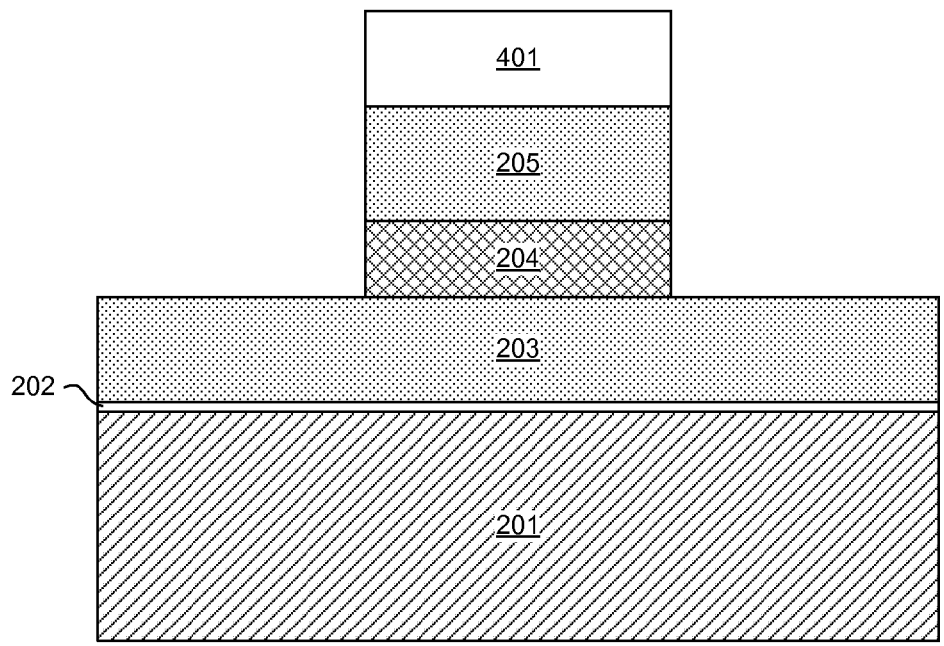
FIG. 6 is a side cut-away view of the embodiment of the semiconductor device of FIG. 5, wherein a doped portion of the polysilicon structure is etched away using the photo-resist layer as a mask.

Next, referring to FIGS. 6 and 10, the exposed portions of doped polysilicon layer 204 may be etched using layer 401 as a mask (step 1006). Unlike undoped polysilicon, n-doped polysilicon does not etch efficiently using HBr. Thus, a more appropriate etchant may be used, such as various fluorine-based etchants commonly used for etching of n-doped polysilicon. For example, a combination of tetrafluoromethane ($CF_4$), octafluorocyclobutane ($C_4F_8$), and nitrogen ($N_2$) may be used as a fluorine-based plasma etchant in an RIE process. Other known etching techniques may be used. In addition, the etching in step 1006 may be a single etching step or may include multiple etching sub-steps performed simultaneously and/or in sequence. The result of etching in step 1006 is that portions of undoped polysilicon layer 203 are exposed, as shown in FIG. 6.

Etching in step 1006 may be end-point-based etching or time-based etching. In end-point-based etching, etching is performed until a particular physical state is detected. Thus, as opposed to time-based etching, which is stopped at the end of a predetermined time period, end-point-based etching is stopped in response to the desired physical state being detected. For instance, in some embodiments, one or more detectors may be used to read the optical chemical signatures of the products produced from etching n-doped polysilicon, which may differ optically from the products produced from etching undoped polysilicon. In alternative embodiments, a technique known as interferometric end-point detection (IEPD) may be used, in which a reflectometer measures the reflectivity of a laser beam by the exposed surface being etched. Using IEPD in step 1006, as the surface of n-doped polysilicon layer 204 is etched away and approaches the upper buried surface of the next buried layer (undoped polysilicon layer 203), the detected reflectivity of the surface oscillates due to alternative constructive and destructive interference between light reflected by the exposed surface and by the buried layer. In response to the oscillation ceasing, it is determined that the buried layer has been exposed. IEPD is useful for polysilicon etching, since polysilicon is optically transparent.

Figure 7:
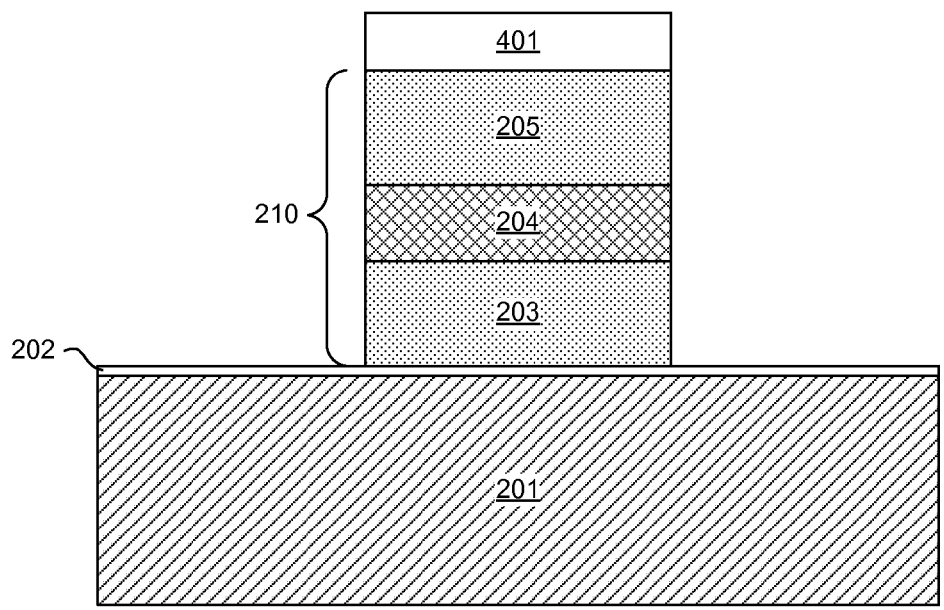
FIG. 7 is a side cut-away view of the embodiment of the semiconductor device of FIG. 6 wherein a lower undoped portion of the polysilicon structure is etched away using the photo-resist layer as a mask.

Next, referring to FIGS. 7 and 10, the exposed portions of undoped polysilicon layer 203 are etched using layer 401 as a mask (step 1007). In some embodiments, the same etchant may be used as was used for etching upper undoped polysilicon layer 205 (for example, HBr). A high-selectivity etchant may be desirable for step 1007 as to reduce the amount of photo-resist layer 401 that is consumed during this etching step. As with the other etching steps described herein, the etching in step 1007 may be a single etching step in some embodiments or may include in other embodiments multiple etching sub-steps performed simultaneously or in sequence. The result of etching in step 1007 is that portions of oxide layer 202 are exposed, as shown in FIG. 7.

In etching step 1007, $O_2$ may also be added to slow the etch rate, thereby allowing for greater etch depth control. This may be particularly desirable when etching polysilicon layer 203, since over-etching into and beyond underlying oxide layer 202 may damage silicon layer 201. In some embodiments, a time-based etch may be used in step 1007. However, in alternative embodiments an end-point-based etch may be used that stops etching in response to detecting the exposure of oxide layer 202. End-point detection techniques at the interface of undoped polysilicon and silicon dioxide are well known.

Figure 8:
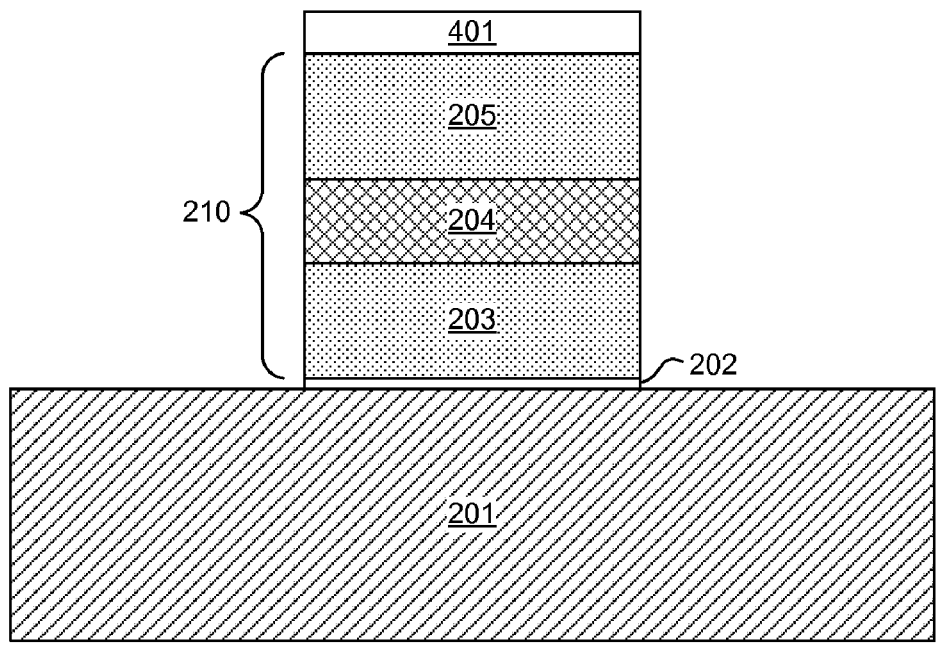
FIG. 8 is a side cut-away view of the embodiment of the semiconductor device of FIG. 7 wherein an insulating layer is etched away using the photo-resist layer as a mask.

Next, referring to FIGS. 8 and 10, the exposed portions of oxide layer 202 are etched using layer 401 as a mask (step 1008). Although any etchant may be used, in some embodiments oxide layer 202 may be etched using the same etchant(s) as undoped polysilicon layer 203. In this example, oxide layer 202 is etched using HBr and $O_2$, where the $O_2$ is used to slow the etch rate, thereby providing added control over etch depth.

In some embodiments, time-based etching may be used when etching oxide layer 202. In alternative embodiments, end-point based etching may be used for etching oxide layer 202, which may allow for a lower risk of unintentionally etching into underlying silicon layer 201. In the embodiment illustrated in FIG. 8, the result of etching in step 1008 is that portions of silicon layer 201 are exposed. Then, the remaining amount of photo-resist layer 401 may be removed using known techniques, thereby resulting in the previously-described structure of FIG. 2.

Next, the structure of FIG. 2 may be annealed at any later time during manufacturing. In some embodiments, such annealing may be a single anneal step. In alternative embodiments, annealing may include multiple anneals. Referring to FIG. 9, annealing causes dopants 901 originally located substantially only in doped polysilicon layer 204 to spread outward into polysilicon layers 203 and 205, thereby causing them to become doped regions as well. This spreading may be sufficient to cause entire polysilicon gate structure 210 to contain an appropriate density of dopant, including that portion of polysilicon gate 210 that is adjacent to gate oxide layer 202. Annealing also activates the dopants, meaning that the dopants are integrated with, and chemically part of, the numerous small crystalline structures of the polysilicon. Once activated, the dopants modify the electrical characteristics of the polysilicon to render it more conductive. Annealing can be performed using any of a variety of known techniques, all of which fundamentally involve heating a structure to a sufficient temperature for a sufficient amount of time to permit dopant diffusion and subsequently cooling the structure.

Figure 11:
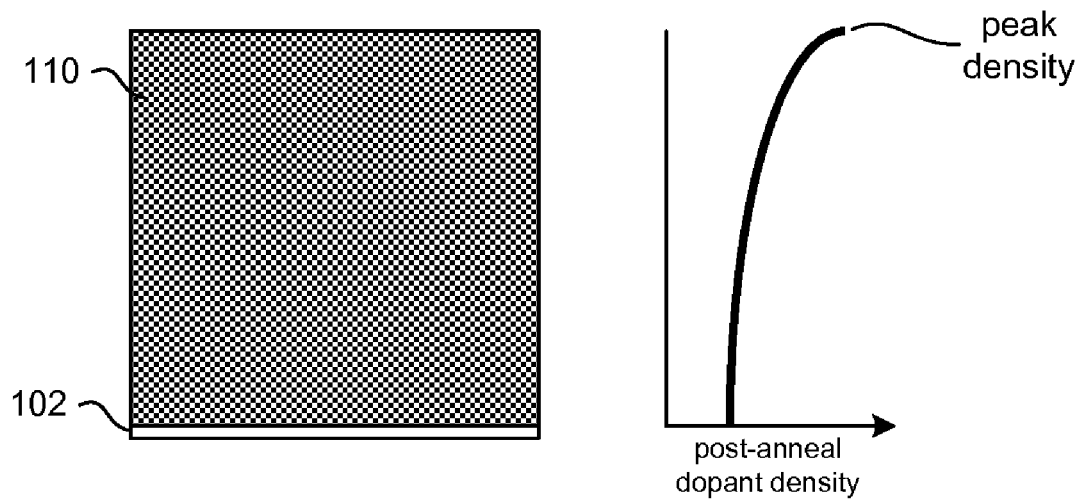
FIG. 11 is a side cut-away view of the embodiment of the polysilicon structure of FIG. 1 after annealing, including an associated post-anneal cross-sectional doping profile graph.
Figure 12:
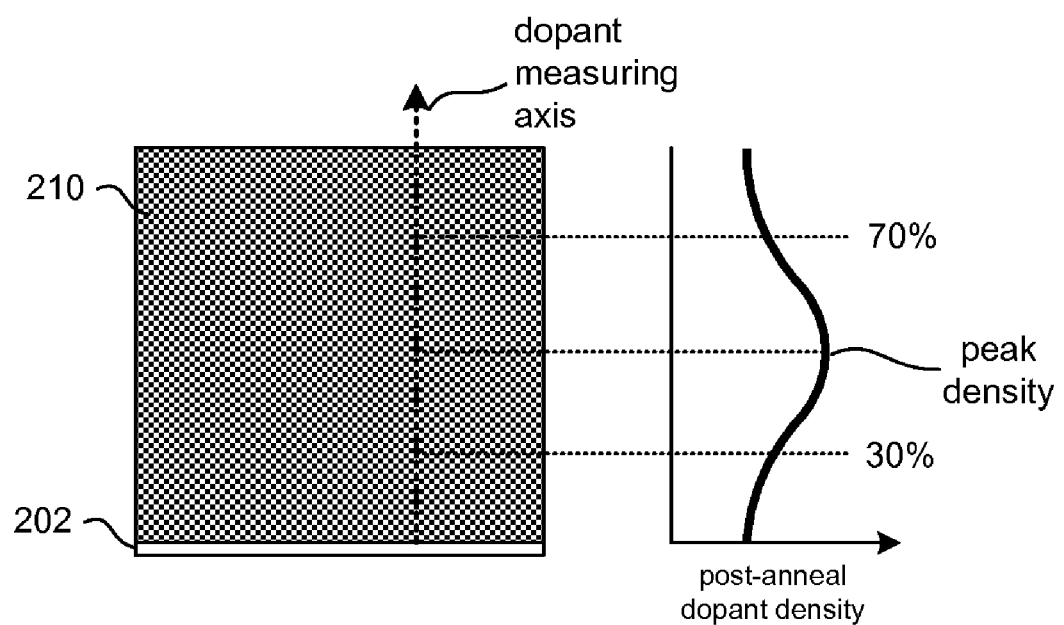
FIG. 12 is a side cut-away view of the embodiment of the polysilicon structure of FIG. 2 after annealing, including an associated post-anneal cross-sectional doping profile graph.

Referring to FIGS. 11 and 12, after annealing, the doping profile of each polysilicon gate structure may differ. As used herein, a doping profile indicates dopant density versus position. Thus, due to the varying doping profiles, the annealed structures that are present in the final marketed semiconductor device may differ from annealed conventional structures. Doping profiles of completed semiconductor devices may be measured using known techniques. The doping profile of an annealed gate structure can provide clues as to how the gate structure was manufactured. In particular, a region in the post-anneal doping profile where the n-type dopant density peaks may indicate a general location of a doped polysilicon layer prior to annealing.

For instance, in FIG. 11, it can be seen that for conventional gate structure 110, a doping profile measured along an axis normal to gate oxide layer 102 is such that a higher density of n-type dopant is present near the top of structure 110 and decreases with position toward gate oxide layer 102. This is consistent with the pre-anneal doped layer 104 being near the top of structure 110. On the other hand, referring to FIG. 12, for gate structure 210, a doping profile measured along an arbitrary dopant measuring axis normal to gate oxide layer 202 indicates that n-type dopant density peaks at a central location of structure 210 and is smaller near both the bottom and top ends. This is consistent with the pre-anneal doped layer 204 being near the middle of structure 210. The peak dopant density may be at any location between the bottom and top ends of polysilicon gate structure 110. For example, in some embodiments, the peak may occur at a location along the dopant measuring axis that is in the range of about 30% to 70% of the total thickness H of gate structure 110. Other doping profiles are possible.

Thus, various new semiconductor devices, as well as methods for manufacturing, have been described herein. By implementing such new devices, it may be possible to decrease line width and ACLV, as well as to realize various other potential advantages discussed herein. It should be noted that, while certain illustrative structures and methods have been discussed herein, other structures and methods are possible. For instance, various aspects described polysilicon gate structures as having n-type doping for use with an NFET. However, these aspects may alternatively or additionally apply to polysilicon gate structures having p-type doping for use with a PFET, or even doped gate structures made of or otherwise including materials other than polysilicon. Moreover, the various aspects described herein may also be applied to semiconductor device structures other than transistor gate structures.

What is claimed is:

1. A method for manufacturing a semiconductor device, comprising:
    forming a first polysilicon layer above a substrate, wherein the first polysilicon layer comprises a doped portion of the first polysilicon layer disposed directly on an undoped portion of the first polysilicon layer; and
    forming a second polysilicon layer directly on a surface of the first polysilicon layer.

2. The method of claim 1, comprising:
    etching the second polysilicon layer using a first etchant;
    etching the doped portion of the first polysilicon layer using a second etchant; and
    etching the undoped portion of the first polysilicon layer using a third etchant.

3. The method of claim 2, wherein the second etchant is different from both the first etchant and the third etchant.

4. The method of claim 3, wherein at least one of the first etchant and the third etchant comprises HBr.

5. The method of claim 4, wherein the second etchant comprises a fluorine-based etchant.

6. A method for manufacturing a semiconductor device, comprising:
    forming a first polysilicon layer above a substrate, wherein the first polysilicon layer comprises a directly on non-doped portion; and
    forming a second polysilicon layer directly on a surface of the first polysilicon layer,
    wherein forming the first polysilicon layer comprises forming the first polysilicon layer to have a first thickness, and wherein forming the second polysilicon layer comprises forming the second polysilicon layer to have a second thickness that is equal to or less than the first thickness.

7. The method of claim 1, wherein forming the first polysilicon layer comprises forming the doped portion by implanting ions into the first polysilicon layer.

8. The method of claim 1, comprising annealing the first polysilicon layer and the second polysilicon layer.

9. The method of claim 6, wherein the first polysilicon layer further comprises an undoped portion, the doped portion of the first polysilicon layer being disposed over the undoped portion of the first polysilicon layer.

10. The method of claim 6, further comprising:
    etching the second polysilicon layer using a first etchant;
    etching the doped portion of the first polysilicon layer using a second etchant; and
    etching an undoped portion of the first polysilicon layer using a third etchant.

11. The method of claim 10, wherein the second etchant is different from both the first etchant and the third etchant.

12. The method of claim 11, wherein at least one of the first etchant and the third etchant comprises HBr.

13. The method of claim 12, wherein the second etchant comprises a fluorine-based etchant.

14. The method of claim 6, wherein forming the first polysilicon layer comprises forming the doped portion by implanting ions into the first polysilicon layer.

15. A method for manufacturing a semiconductor device, comprising:
    forming a first polysilicon layer above a substrate, wherein the first polysilicon layer comprises a doped portion of the first polysilicon layer disposed directly on an undoped portion of the first polysilicon layer; and
    forming a second polysilicon layer directly on the doped portion of the first polysilicon layer.

16. The method of claim 15, further comprising:
    etching the second polysilicon layer using a first etchant;
    etching the doped portion of the first polysilicon layer using a second etchant; and
    etching the undoped portion of the first polysilicon layer using a third etchant.

17. The method of claim 15, wherein the second etchant is different from both the first etchant and the third etchant.

18. The method of claim 17, wherein at least one of the first etchant and the third etchant comprises HBr.

19. The method of claim 18, wherein the second etchant comprises a fluorine-based etchant.

20. The method of claim 15, wherein forming the first polysilicon layer comprises forming the first polysilicon layer to have a first thickness, and wherein forming the second polysilicon layer comprises forming the second polysilicon layer to have a second thickness that is equal to or less than the first thickness.

21. The method of claim 15, wherein forming the first polysilicon layer comprises forming the doped portion by implanting ions into the first polysilicon layer.

* * * * *